United States Patent [19]
Kim et al.

[11] Patent Number: 5,796,277
[45] Date of Patent: Aug. 18, 1998

[54] POWER-TRANSISTOR DRIVING CIRCUIT FOR A SINGLE POWER SOURCE

[75] Inventors: Yong-ho Kim, Seoul; Young-sik Lee; Hyun-min Jo, both of Kyonggi-do, all of Rep. of Korea

[73] Assignee: Samsung Electronics Co., Ltd., Kyonggi-do, Rep. of Korea

[21] Appl. No.: 612,728

[22] Filed: Mar. 8, 1996

[30] Foreign Application Priority Data

Aug. 11, 1995 [KR] Rep. of Korea ............ 95-24833

[51] Int. Cl.$^6$ ............................................. H03K 3/00
[52] U.S. Cl. ................... 327/108; 327/110; 327/389; 327/434; 360/67
[58] Field of Search ................... 327/108, 109, 327/110, 111, 112, 379, 389–391, 427, 432–434, 437; 360/46, 67, 68

[56] References Cited

U.S. PATENT DOCUMENTS

| | | | |
|---|---|---|---|
| 3,562,561 | 2/1971 | Klosterman | 327/576 |
| 3,646,392 | 2/1972 | Zahnen et al. | 327/540 |
| 3,705,342 | 12/1972 | Dalke | 379/176 |
| 3,748,569 | 7/1973 | Frank et al. | 323/278 |
| 4,636,709 | 1/1987 | Ohsawa | 323/267 |
| 4,660,135 | 4/1987 | Lee | 363/21 |
| 4,900,951 | 2/1990 | Saito et al. | 327/545 |
| 4,939,455 | 7/1990 | Tsugawa | 324/168 |
| 5,132,582 | 7/1992 | Price, Jr. | 360/68 |
| 5,386,328 | 1/1995 | Chiou et al. | 360/68 |
| 5,416,361 | 5/1995 | John et al. | 327/110 |

FOREIGN PATENT DOCUMENTS

| | | | |
|---|---|---|---|
| 2-228124 | 9/1990 | Japan | 327/108 |
| 5-266405 | 10/1993 | Japan | 360/68 |

OTHER PUBLICATIONS

Leonhardt, IBM Technical Disclosure Bulletin, vol.23, No. 9, Feb. 1981.

*Primary Examiner*—Timothy P. Callahan
*Assistant Examiner*—Kenneth B. Wells
*Attorney, Agent, or Firm*—Cushman Darby & Cushman IP Group of Pillsbury Madison & Sutro LLP

[57] ABSTRACT

A power transistor driving circuit for a single power source drives a predetermined load and prevents each of the drive circuit transistors from being damaged because they are not turned on simultaneously.

11 Claims, 3 Drawing Sheets

POWER-TRANSISTOR DRIVING CIRCUIT FOR A SINGLE POWER SOURCE

BACKGROUND OF THE INVENTION

(1) Field of the Invention

The present invention relates to a power-transistor driving circuit for a single power source, and more particularly, to a circuit for driving a power transistor used instead of a relay to drive a predetermined load and preventing each circuit from being damaged by transistors that are not turned on simultaneously.

(2) Description of the Prior Art

With reference to the drawings, a prior art circuit for driving a motor for a single power source is described below.

FIG. 1 is a detailed circuit diagram illustrating a prior art circuit for driving a motor with a single power source.

As illustrated in FIG. 1, a prior art motor-driving circuit for a single power source comprises a first relay Rax. The plus terminal of a direct current single power source Vdc is connected to a terminal a' of the relay Rax and to one terminal of a coil. The coil can include a metal support. The ground terminal of the single power source Vdc is connected to the terminal a of the relay Rax.

The prior art motor-driving circuit also includes a second relay Rbx. The plus terminal of the direct current single power source Vdc is connected to the terminal b' of the relay Rbx and to one terminal of a coil. This coil can also include a metal support. The ground terminal of the single power source Vdc is connected to terminal b of the relay Rbx.

The prior art motor-driving circuit also includes transistors Q1 and Q2 which receive transistor drive signals sgn1 and sgn2 at their respective bases. Each of these transistors has a collector terminal respectively connected to the relays Rax and Rbx, and an emitter terminal connected to a common ground terminal. The motor M driven by the relay circuit is connected between output terminals of relays Rax and Rbx.

The terminals a, b of the relays Rax and Rbx are respectively connected to the output terminals ao and bo when the relays are not operated. The terminals a' and b' are connected to the output terminal ao and bo when the relays are operated.

The prior art motor driving circuit for a single power source uses two relays Rax and Rbx to rotate the motor in two directions. Namely, using relays Rax and Rbx to reverse the polarity of the power source Vdc connected to the motor M, causes the rotation direction of the motor M to change.

However, the relay used in the prior art motor driving circuit for a single power source can have an arc generated at the relay contact points if the frequency of use is increased to higher frequencies, and thus the frequency of use is limited. In addition, an arc will generate unwanted noise.

SUMMARY OF THE INVENTION

An object of the invention is to solve the problems of the conventional motor driving circuit, and to provide a circuit for driving a power transistor which is used instead of a relay to drive a predetermined load.

It is also an object of the present invention to prevent circuit damage caused by transistors that are not turned on simultaneously.

To achieve these and other objects, the present invention comprises: a diode which has an anode connected to a plus terminal of a DC-single power source and passes only a positive current therethrough; a first transistor which receives a controlling signal at a base input, an emitter terminal connected to a ground terminal, and which controls the flow of the positive current by being turned on/off via the control signal; a first resistor which is connected to a cathode terminal of the diode and to a collector terminal of the first transistor and transmits a power; a second resistor which has one terminal connected to the collector terminal of the first transistor and transmits power; a third resistor which has one terminal connected to another terminal of the second resistor and transmits power; a second transistor which has a base terminal connected to another terminal of the third resistor and an emitter terminal connected to a ground terminal and which is turned on/off via the power transmitted through the third resistor; a fourth resistor which has one terminal connected to a collector terminal of the second transistor and transmits power generated in the second transistor; a third transistor which has a base terminal connected to another terminal of the fourth resistor and which is turned on/off via the signal transmitted through the fourth resistor; a capacitor which has one terminal connected to a cathode of the diode, and which is charged via power transmitted by the diode when the first transistor is turned on and is discharged when the first transistor is turned off; a fifth resistor connected to a cathode of the diode and to an emitter terminal of the third transistor and which transmits the power discharged from the capacitor; and a sixth resistor which is connected to another terminal of the capacitor and to a collector terminal of the third transistor and which transmits the power discharged form the capacitor.

To achieve the above and other objects, another embodiment of the invention for driving a load such as a motor, comprises: a power supplying unit which supplies a stabilized power to drive the entire circuit; a load driving circuit comprising a plurality of power transistors operatively connected to receive power from the power supply and to receive gate driving signals and operatively connectable to a load; first power transistor driving circuit operatively connected to the power supply, connectable to receive a transistor-controlling signal and operatively connected to a first group of the power transistors for generating first ones of the gate driving signals so as to prevent the power transistors of the first group of power transistors from simultaneously turning on; and second power transistor driving circuit operatively connected to the power supply, connectable to receive a transistor-controlling signal and operatively connected to a second group of the power transistors, for generating second ones of the gate driving signals so as to prevent the power transistors of the second group of transistors from simultaneously turning on.

DETAILED DESCRIPTION OF THE PREFERRED EMBODIMENTS

With reference to the drawings, the preferred embodiments of the present invention are described below.

Figure 1:
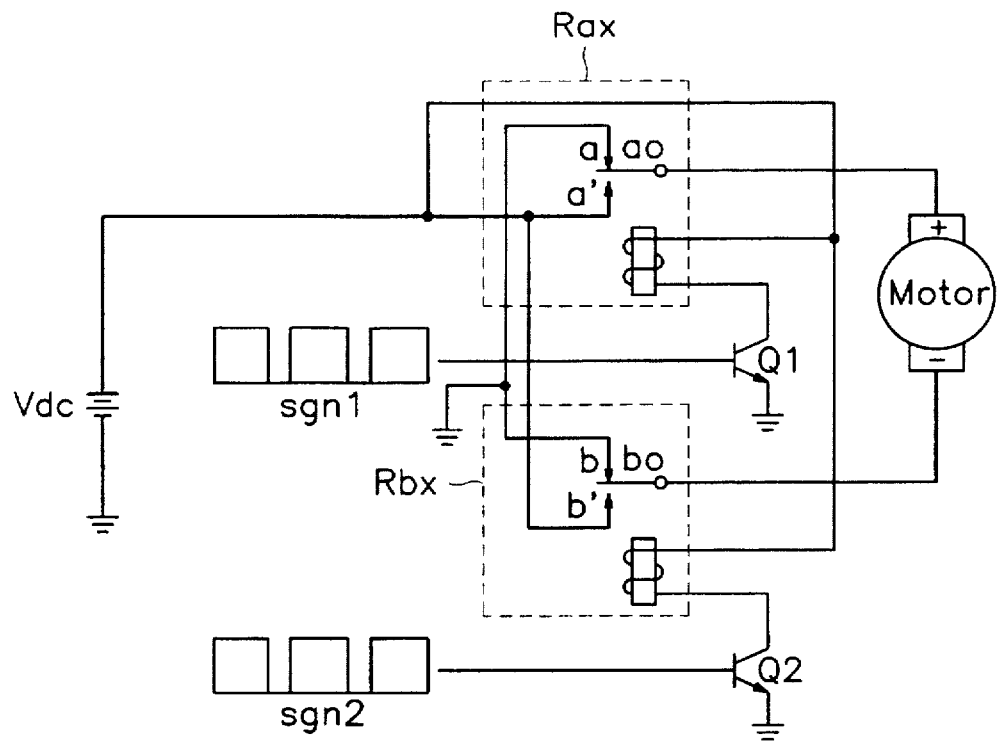
FIG. 1 is a detailed circuit diagram illustrating a conventional motor driving circuit for a signal power source.
Figure 2:
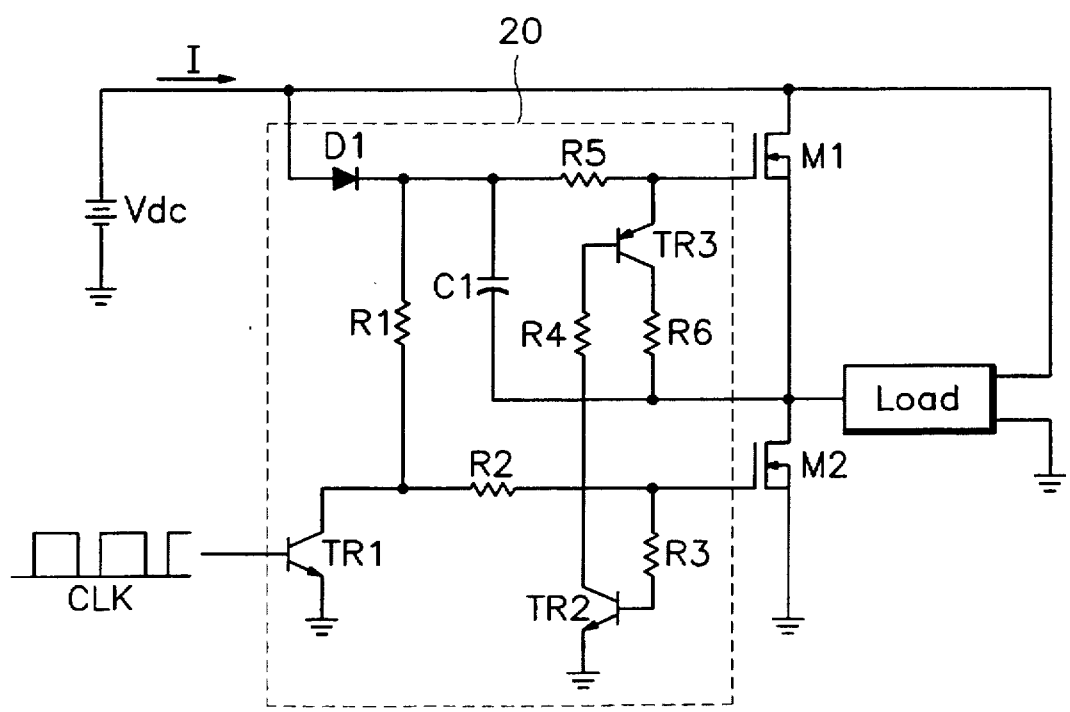
FIG. 2 is a detailed circuit diagram illustrating a n-oxidesilicon MOS-transistor driving circuit for a single power source according to a first embodiment of the present invention.

As illustrated in FIG. 2, a metal oxide semiconductor MOS-transistor driving circuit for a single power source according to a first embodiment of the invention includes: a diode D1 which has an anode connected to a plus terminal of the DC-single power source Vdc and allows only a positive current to pass through it; a first transistor TR1 which receives a CLK control signal at its base input, has an emitter terminal connected to a ground terminal, and controls the flow of the positive current by being turned on/off via the control signal; a first resistor R1 which is connected to a cathode terminal of the diode D1 and a collector terminal of the first transistor TR1 and which transmits power; a second resistor R2 which has one terminal connected to the collector terminal of the first transistor TR1 and which transmits power; a third resistor R3 which has one terminal connected to the other terminal of the second resistor R2 and which transmits power; a second transistor TR2 which has a base terminal connected to the other terminal of the third resistor R3 and an emitter terminal to a ground terminal and which is turned on/off by the power transmitted through the third resistor R3; a fourth resistor R4 which has one terminal connected to a collector terminal of the second transistor TR2 and which transmits power from the second transistor TR2; a third transistor TR3 which has a base terminal connected to the other terminal of the fourth resistor R4 and which is turned on/off by the signal transmitted through the fourth resistor R4; a capacitor C1 which has one terminal connected to a cathode of the diode D1 and which is charged by power transmitted by the diode D1 when the first transistor TR1 is turned on and is discharged when the first transistor TR1 is turned off; a fifth resistor R5 is connected to a cathode of the diode D1 and to an emitter terminal of the third transistor TR3 and transmits power discharged from the capacitor C1; and a sixth resistor R6 which is connected to the other terminal of the capacitor C1 and to a collector terminal of the third transistor TR3 and which transmits the power discharged from the capacitor C1.

The transistors TR1 and TR2 comprise npn-type transistor and the transistor TR3 comprises a pnp-type transistor.

Figure 3:
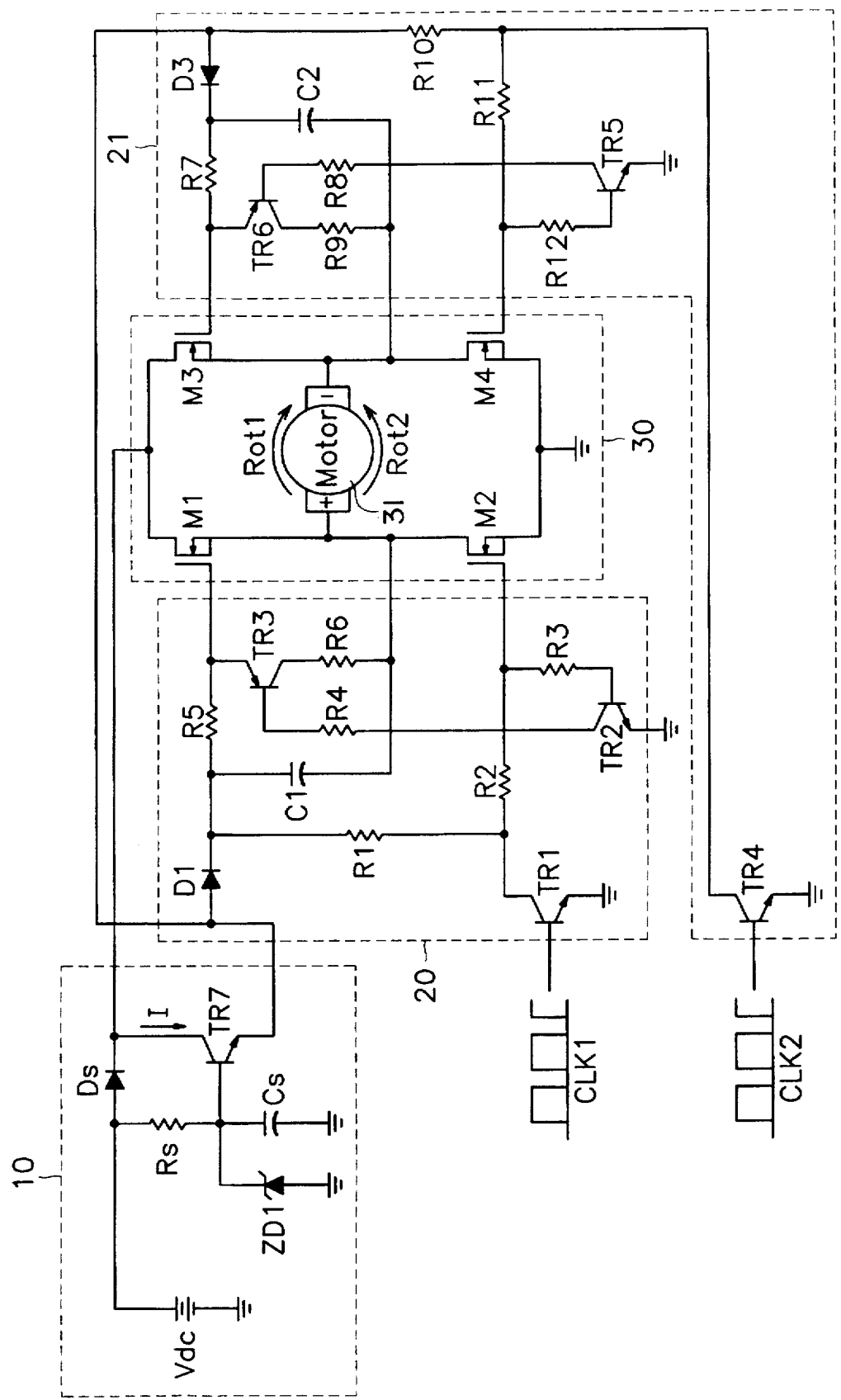
FIG. 3 is a detailed circuit diagram illustrating a motor driving circuit for a single power source according to a second embodiment of the present invention.

As illustrated in FIG. 3, the motor driving circuit for a single power source according to the second embodiment of the present invention, comprises: a power supplying unit 10 which supplies a stabilized power to drive the entire circuit; a load driving unit 30 which has four power transistors M1 to M4 that receive power from the power supplying unit 10 and receive gate driving signals, the load driving unit is driven according to the gate driving signals; and a motor 31 that is driven in a positive/negative direction by the power transistors. This embodiment also includes a first power transistor driving circuit 20 which receives the signals from the power supplying unit 10 and a transistor-controlling signal CLK1 to drive the power transistors of the load-driving unit, and which generates each gate driving signal of upper and lower power transistors so as to prevent the first power transistor of the upper and lower power transistors M1 and M2 from turning on simultaneously by controlling the on/off switching of the internal transistors; and a second power transistor driving circuit 21. This circuit is constructed as the first power transistor driving circuit 20 and generates each gate driving signal of the upper and lower power transistors M3 and M4 so as to prevent the first power transistor of the upper and lower parts M3 and M4 from turning on simultaneously by controlling the on/off switching of the internal transistors.

The MOS-transistor M1 to M4 comprise n-channel transistors.

The power supplying unit 10 comprises: a diode Ds which has an anode connected to a plus terminal of the DC-single power source Vdc and which supplies a positive current; a resistor Rs which has one terminal connected to an anode of the diode Ds and which transmits power; a zener-diode ZD1 which is connected to the other terminal of the resistor Rs and to the ground terminal and maintains a regular voltage; a capacitor Cs which is connected in parallel with the zener-diode ZD1 and which is charged and discharged by the voltage supplied by the zener diode ZD1; and a transistor TR7 which has a base terminal connected to one terminal of the capacitor Cs, a collector terminal connected to the cathode of the diode Ds, and which is turned on and off by the capacitor voltage so as to supply power to the first and second power transistor driving circuits 20 and 21.

The load driving unit 30 includes: two upper power transistors M1 and M3, to which power supplied from the power supplying unit 10 is applied to a common drain terminal and which are driven by gate driving signals that are applied to each gate terminal; two lower power transistors M2 and M4, which have drain terminals connected to each source terminal and the common source terminal connected to the ground terminal, and which receive gate driving signals at their gate terminals; and a motor which is connected between the two source terminals of upper power transistors M1 and M3 and which is driven in either a positive or negative direction by the power transistors.

The first embodiment of the present invention operates as described below.

As illustrated in FIG. 2, if transistor TR1 is turned off, the current I flows into the base terminal of the transistor TR2 through the diode D1, and resistors R1 to R3. This turns transistor TR2 on. At this point, the lower MOS-transistor M2 is also turned on.

If transistor TR2 is turned on, transistor TR3 is also turned on. This discharges capacitor C1 through resistor R5, transistor TR3 and resistor R6. The discharge causes the voltage across C1 to decrease. If the voltage across capacitor C1 is below a predetermined voltage, the upper MOS-transistor M1 is turned off. Accordingly, when transistor TR1 is turned off, the current I passes through the load to the lower MOS-transistor M2.

Next, if transistor TR1 is turned on by the transistor control signal CLK from its previous off state, the lower MOS-transistor M2 is turned off, and simultaneously transistor TR2 turns off. When transistor TR2 is turned off, the current I charges the capacitor C1 through diode D1. When the voltage across capacitor C1 is above a predetermined voltage, the upper MOS-transistor M1 is turned on. When the upper MOS-transistor M1 is turned on, the current I flows through the upper MOS-transistor M1 to the load. Accordingly, because the MOS-transistors M1 and M2 are not turned on simultaneously, each element M1 and M2 is not damaged.

Figure 4:
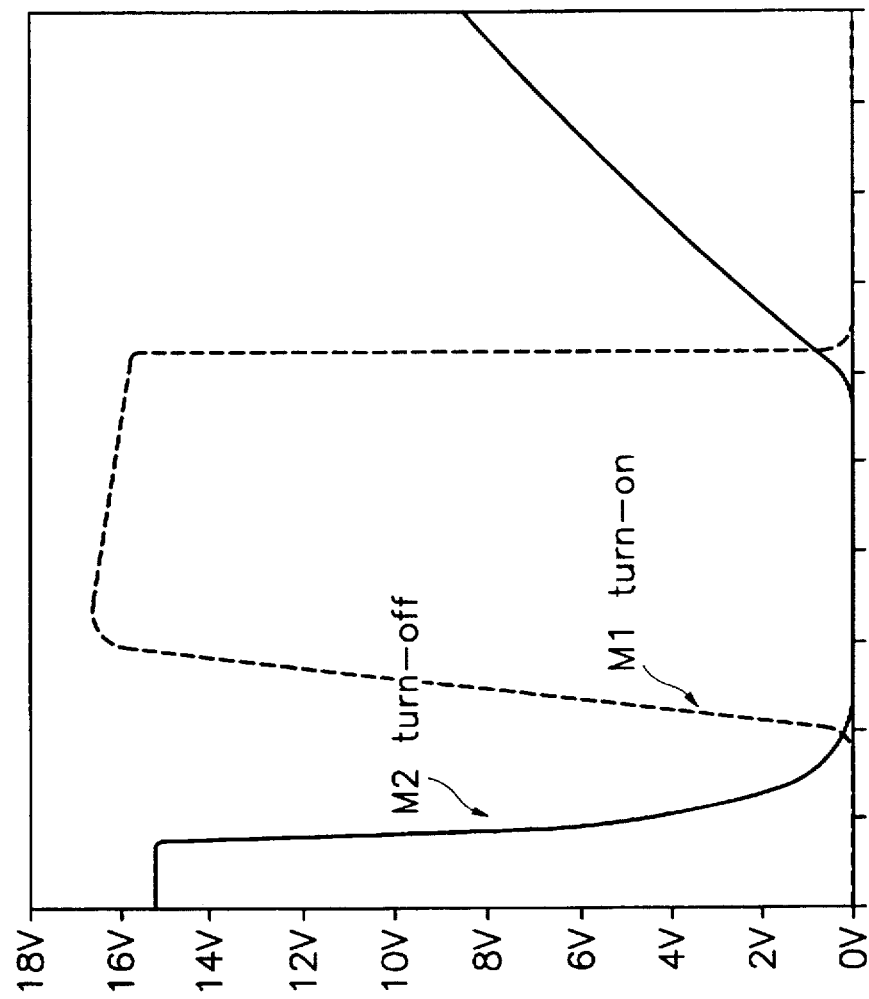
FIG. 4 is a timing diagram of a MOS-transistor driving circuit for a single power source according to a first embodiment of the present invention.

As illustrated in FIG. 4, when transistor TR1 is turned on from its previous off state, the upper MOS-transistor M1 is turned on, and the lower MOS-transistor M2 is turned off.

The following describes the second embodiment of the present invention.

As illustrated in FIG. 3, control signals CLK1 and CLK2 are respectively applied to the base terminal of transistors TR1 and TR4. This prevents the upper and lower MOS-transistors M1 to M4 of the load transistor 30 from being turned on simultaneously.

When the motor of the load driving unit 30 is not driven, transistors TR1 and TR4 remain turned off. When transistors TR1 and TR4 are off, the values of the resistors R1, R2, R3, and R10, R11, R12 are set in order to turn on transistors TR2 and TR5. When transistors TR2 and TR5 are turned on, transistors TR3 and TR6 are turned on. This leads to the sustained off state of the upper MOS-transistors M1 and M3, and the lower MOS-transistors M2 and M4 are turned on. Thus, the motor is not driven.

The rotating direction of the Motor when MOS-transistors M1 and M4 are turned on and the MOS-transistors M2 and M3 are turned off is defined as Rot1. To rotate the Motor in the Rot1 direction, transistor TR1 is turned on. If transistor TR1 is turned on, the lower MOS-transistor M2 and the transistor TR2 are turned off. When transistor TR2 is turned off, transistor TR3 is turned off, and the current I charges capacitor C1 through the transistor TR7 and the diode D1. If the voltage of the capacitor C1 is above a predetermined voltage, the upper MOS-transistor M1 is turned on. At this time, while the lower MOS-transistor M2 remains turned off, the upper MOS-transistor M1 and the lower MOS-transistor M2 are not be turned on simultaneously.

On the contrary, when the rotating direction of the motor 31 is Rot2, the MOS-transistors M1 and M4 should be turned off. This changes the rotating direction by changing the polarity of the power source connected to the motor.

To turn on MOS-transistors M2 and M3 and turn off the MOS-transistors M1 and M4, transistor TR4 should just be turned on. When transistor TR4 is turned on, transistors TR5 and TR6 are turned off. Therefore, the current I charges capacitor C2 through the transistor TR7 and diode D3. If the voltage of the capacitor C2 is above a predetermined voltage, the upper MOS-transistor M3 is turned on. At this time, while the lower MOS-transistor M4 remains off, the upper MOS-transistor M3 and the lower MOS-transistor M4 are not turned on simultaneously.

Accordingly, the transistor TR1 is turned off, the MOS-transistors M1 and M4 are turned off, and the MOS-transistors M2 and M3 are turned on, and thus the rotating direction of the motor 31 is Rot2.

The power transistor driving circuit as described above may be applied to various areas such a circuit for driving a car-window motor and a power antenna driving device.

Consequently, the effects of the power transistor driving circuit according to the first and second embodiments of the present invention are to drive a power transistor used as a switching circuit instead of a relay to drive a predetermined load and to prevent the power transistors from being damaged because they are not turned on simultaneously.

What is claimed is:

1. A power transistor driving circuit for use with a single power source and for driving a power transistor, comprising:
   a diode having an anode connectable to receive a plus voltage from the single power source, and a cathode;
   a first transistor having a base connectable to receive a control signal, an emitter terminal operatively connected to a ground terminal, and a collector;
   a first resistor operatively connected between said cathode of said diode and said collector terminal of said first transistor;
   a second resistor having a terminal operatively connected to said collector of said first transistor and having another terminal;
   a third resistor having a terminal operatively connected to said other terminal of said second resistor and having another terminal;
   a second transistor having a base operatively connected to said other terminal of said third resistor, an emitter operatively connected to a ground terminal and having a collector;
   a fourth resistor having a terminal operatively connected to said collector of said second transistor and having another terminal;
   a third transistor having a base operatively connected to said other terminal of said fourth resistor and having a collector;
   a capacitor having a terminal operatively connected to said cathode of said diode, and having another terminal;
   a fifth resistor operatively connected between said cathode of said diode and said emitter of said third transistor; and
   a sixth resistor having a terminal operatively connected to said other terminal of said capacitor and to said collector terminal of said third transistor.

2. The power transistor driving circuit for use with a single power source as defined in claim 1, wherein said first and second transistors are npn-type transistors.

3. The power transistor driving circuit for use with a single power source as defined in claim 1, wherein said third transistor is a pnp-type transistor.

4. A power transistor driving circuit for use with a single power source and for driving power transistors, comprising:
   a power supply;
   a load driving circuit comprising a plurality of power transistors operatively connected to receive power from said power supply and to receive gate driving signals and operatively connectable to a load;
   first power transistor driving means operatively connected to said power supply, connectable to receive a first transistor-controlling signal and operatively connected to a first group of said power transistors for generating first ones of said gate driving signals so as to prevent said power transistors of said first group of power
   said group of said power transistors includes a first upper power transistor having a gate, drain and source, and a first lower power transistor having a gate, drain and source, the source of the first upper transistor being connected to the drain of said first lower transistor at a first junction, and
   said first single circuit of said first power transistor driving means comprises a first capacitor connected to said first junction at one end and being chargeable by said power supply through its other end when said first lower power transistor is turned off to enable said first upper power transistor to be turned on; and
   second power transistor driving means operatively connected to said power supply, connectable to receive a second transistor-controlling signal and operatively connected to a second group of said power transistors, for generating second ones of said gate driving signals so as to prevent said power transistors of said second group of transistors from simultaneously turning on, wherein
   said second group of said power transistors includes a second upper power transistor having a gate, drain and source, a second lower power transistor having a gate, drain and source, the source of said second upper power transistor being connected to said drain of said second lower power transistor at a second junction, and
   said second single circuit of said second power transistor driving means comprises a second capacitor connected to said second junction at one end and being chargeable by said power supply through its other end when said second lower power transistor is turned off to enable said second upper power transistor to be turned on.

5. The power transistor driving circuit for use with a single power source as defined in claim 4, wherein
said drains of said first and second upper power transistors are commonly and operatively connected to said power supply, and said gates of said first and second upper power transistors are operatively connected to receive respective ones of said first and second ones of said gate driving signals;
said source of said first and second lower power transistors are commonly and operatively connected to a ground terminal, and said gates of said first and second lower power transistors are operatively connected to receive respective ones of said first and second ones of said gate driving signals; and
a load operatively connected between said source terminals of said first and second upper power transistors.

6. The power transistor driving circuit for use with a single power source as defined in claim 5, wherein said power transistors are n-channel MOS-transistors.

7. A power transistor driving circuit for use with a single power source and for driving power transistors, comprising:
a power supply;
a load driving circuit comprising a plurality of power transistors operatively connected to receive power from said power supply and to receive gate driving signals and operatively connectable to a load;
first power transistor driving means operatively connected to said power supply, connectable to receive a first single transistor-controlling signal and operatively connected to a first group of said power transistors for generating first ones of said gate driving signals so as to prevent said power transistors of said first group of power transistors from simultaneously turning on, wherein said first power transistor driving means comprises a first single circuit receiving said first single transistor-controlling signal and driving all of said power transistors in said first group of said power transistors;
second power transistor driving means operatively connected to said power supply, connectable to receive a second single transistor-controlling signal and operatively connected to a second group of said power transistors, for generating second ones of said gate driving signals so as to prevent said power transistors of said second group of transistors from simultaneously turning on, wherein said second power transistor driving means comprises a second single circuit receiving said second single transistor-controlling signal and driving all of said power transistors in said second group of said power transistors;
wherein:
said first group of said power transistors includes a first upper power transistor having a gate, drain and source, and a first lower power transistor having a gate, drain and source, the source of the first upper transistor being connected to the drain of said first lower transistor at a first junction; and wherein
said first single circuit of said first power transistor driving means comprises a first capacitor connected to said first junction at one end and being chargeable by said power supply through its other end when said first lower power transistor is turned off to enable said first upper power transistor to be turned on.

8. The power transistor driving means of claim 7, wherein:
said second group of said power transistors includes a second upper power transistor having a gate, drain and source, a second lower power transistor having a gate, drain and source, the source of said second upper power transistor being connected to said drain of said second lower power transistor at a second junction; and
said second single circuit of said second power transistor driving means comprises a second capacitor connected to said second junction at one end and being chargeable by said power supply through its other end when said second lower power transistor is turned off to enable said second upper power transistor to be turned on.

9. The power transistor driving circuit as defined in claim 8, wherein:
said first single circuit of said first power transistor driving means further comprises a first diode connected to said other end of said first capacitor and to said power supply; and
said second single circuit of said second power transistor driving means further comprises a second diode connected to said other end of said second capacitor and to said power supply.

10. A power transistor driving circuit for use with a single power source and for driving power transistors, comprising:
a power supply;
a load driving circuit comprising a plurality of power transistors operatively connected to receive power from said power supply and to receive gate driving signals and operatively connectable to a load;
first power transistor driving means operatively connected to said power supply, connectable to receive a first transistor-controlling signal and operatively connected to a first group of said power transistors for generating first ones of said gate driving signals so as to prevent said power transistors of said first group of power transistors from simultaneously turning on;
second power transistor driving means operatively connected to said power supply, connectable to receive a second transistor-controlling signal and operatively connected to a second group of said power transistors, for generating second ones of said gate driving signals so as to prevent said power transistors from simultaneously turning on,
wherein said power supply comprises:
a diode having an anode connectable to receive a plus voltage from the single power source and having a cathode;
a resistor having a terminal operatively connected to said anode of said diode and having another terminal;
a zener-diode operatively connected between said other terminal of said resistor and a ground terminal;
a capacitor operatively connected in parallel to said zener-diode; and
a transistor having a base operatively connected to a terminal of said capacitor, a collector connected to said cathode of said diode and an emitter operatively connected to said first and second power transistor driving means.

11. The power transistor driving circuit for use with a single power source as defined in claim 10, wherein said transistor of said power supply is npn-type transistor.

* * * * *